US010707437B2

(12) United States Patent
Hao et al.

(10) Patent No.: US 10,707,437 B2
(45) Date of Patent: Jul. 7, 2020

(54) TOP-EMITTING OLED DEVICE, METHOD OF MANUFACTURING THE SAME, AND DISPLAY PANEL

(71) Applicant: Shenzhen China Star Optoelectronics Technology Co., Ltd., Shenzhen, Guangdong (CN)

(72) Inventors: Peng Hao, Guangdong (CN); Yunan Zhang, Guangdong (CN)

(73) Assignee: SHENZHEN CHINA STAR OPTOELECTRONICS TECHNOLOGY CO., LTD., Shenzhen, Guangdong (CN)

( * ) Notice: Subject to any disclaimer, the term of this patent is extended or adjusted under 35 U.S.C. 154(b) by 94 days.

(21) Appl. No.: 15/552,785

(22) PCT Filed: Jun. 15, 2017

(86) PCT No.: PCT/CN2017/088354
§ 371 (c)(1),
(2) Date: Aug. 22, 2017

(87) PCT Pub. No.: WO2018/196124
PCT Pub. Date: Nov. 1, 2018

(65) Prior Publication Data

US 2018/0315949 A1 Nov. 1, 2018

(30) Foreign Application Priority Data

Apr. 28, 2017 (CN) .......................... 2017 1 0294117

(51) Int. Cl.
*H01L 51/52* (2006.01)
*H01L 51/56* (2006.01)
(Continued)

(52) U.S. Cl.
CPC ...... *H01L 51/5228* (2013.01); *H01L 51/0022* (2013.01); *H01L 51/5225* (2013.01);
(Continued)

(58) Field of Classification Search
None
See application file for complete search history.

(56) References Cited

U.S. PATENT DOCUMENTS

2005/0093435 A1 5/2005 Suh et al.
2013/0069067 A1 3/2013 Youn
(Continued)

FOREIGN PATENT DOCUMENTS

CN 103000814 A 3/2013
CN 105789479 A 7/2016
(Continued)

*Primary Examiner* — Robert K Carpenter
(74) *Attorney, Agent, or Firm* — Leong C. Lei

(57) ABSTRACT

The present invention discloses a top-emitting OLED device, a method of manufacturing the same, and a display panel. The OLED device includes a substrate, an anode layer, an organic functional layer, a cathode layer, and an auxiliary electrode layer sequentially arranged, wherein the auxiliary electrode layer is arranged on the non-light emitting region of the cathode layer, and the material of the auxiliary electrode layer is electrically conductive. The present invention can increase the conductivity of the cathode layer, reduce the voltage difference between the center and the edge of the screen, and improve the display effect without blocking the light emitting region and not affecting the display brightness of the light emitting region.

10 Claims, 4 Drawing Sheets

50
40
305
304
303
30
302
301
20
10

(51) Int. Cl.
*H01L 51/00* (2006.01)
*H01L 27/32* (2006.01)

(52) U.S. Cl.
CPC ...... *H01L 51/5231* (2013.01); *H01L 51/5234* (2013.01); *H01L 51/56* (2013.01); *H01L 27/3248* (2013.01); *H01L 51/5284* (2013.01); *H01L 2227/323* (2013.01); *H01L 2251/301* (2013.01); *H01L 2251/308* (2013.01); *H01L 2251/5315* (2013.01); *H01L 2251/556* (2013.01); *H01L 2251/558* (2013.01)

(56) References Cited

U.S. PATENT DOCUMENTS

2015/0144922 A1* 5/2015 Moon ................ H01L 27/3279 257/40
2016/0035803 A1* 2/2016 Kim ................... H01L 27/3246 257/40
2016/0233458 A1 8/2016 Shen et al.

FOREIGN PATENT DOCUMENTS

CN 105932028 A 9/2016
CN 106531770 A 3/2017

* cited by examiner

TOP-EMITTING OLED DEVICE, METHOD OF MANUFACTURING THE SAME, AND DISPLAY PANEL

TECHNICAL FIELD

The present invention relates to the field of display technology, and more particularly to a top-emitting OLED device, a method of manufacturing the same, and a display panel.

BACKGROUND OF RELATED ART

OLED (Organic Light-Emitting Diode) device has become the most promising novel display device in recent years with its advantages such as self-emission, all solid state, and high contrast. In the large-size OLED screen production, because the bottom-emitting OLED is affected by the aperture rate, the high resolution is difficult to achieved, therefore more and more manufacturers achieve higher resolution through the development of the top-emitting OLED.

In the long-term development, the inventors of the present application have found that a thin transparent metal is used as a cathode and is connected to the edge circuit of the screen in order to take into account the light transmittance when fabricating the top-emitting OLED device. However, due to the fact that the thinner transparent metal has larger resistance, when the screen size becomes larger, the drive voltage difference between the center and the edge of the screen becomes too large, causing the voltage drop, affecting the display effect.

SUMMARY

The technical problem that the present invention mainly solves is to provide a top-emitting OLED device, a method of manufacturing the same, and a display panel, which can reduce the voltage difference between the center and the edge of the screen to improve the display effect.

To solve the above technical problem, a technical proposal adopted by the present invention is to provide a top-emitting OLED device, including:

a substrate, an anode layer, an organic functional layer, a cathode layer, and an auxiliary electrode layer sequentially arranged, wherein the auxiliary electrode layer is arranged on a non-light emitting region of the cathode layer, and the material of the auxiliary electrode layer is electrically conductive.

To solve the technical problem, another aspect of the present invention is to provide a method of manufacturing a top-emitting OLED device, including:

preparing an anode layer, an organic functional layer, and a cathode layer on a substrate in turn;

forming an auxiliary electrode layer on the non-light emitting region of the cathode layer, wherein a material of the auxiliary electrode layer is electrically conductive.

To solve the technical problem, another aspect of the present invention is to provide a display panel, including:

a top-emitting OLED device, including a substrate, an anode layer, an organic functional layer, a cathode layer, and an auxiliary electrode layer sequentially arranged, wherein the auxiliary electrode layer is arranged on the non-light emitting region of the cathode layer, and the material of the auxiliary electrode layer is electrically conductive;

a driving circuit, coupled to the anode layer and/or the cathode layer, for controlling the light emission of the OLED device.

By providing the conductive auxiliary electrode layer on the non-light emitting region of the cathode layer of the OLED device, the present invention can increase the conductivity of the cathode layer, reduce the voltage difference between the center and the edge of the screen, and improve the display effect without blocking the light emitting region and not affecting the display brightness of the light emitting region.

DETAILED DESCRIPTION OF EMBODIMENTS

The technical proposals in the embodiments of the present invention will be described in detail below in connection with the accompanying drawings in the embodiments of the present invention.

Figure 1:
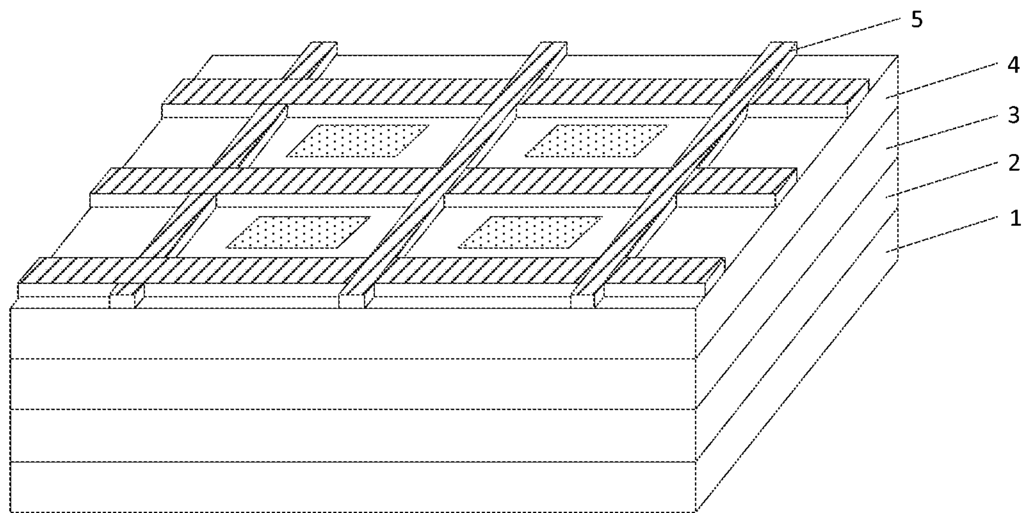
FIG. 1 is a schematic structural view of an embodiment of the top-emitting OLED device according to the present invention.

Referring to FIG. 1, an embodiment of the top-emitting OLED device of the present invention includes:

a substrate 1, an anode layer 2, an organic functional layer 3, a cathode layer 4, and an auxiliary electrode layer 5, wherein the auxiliary electrode layer 5 is arranged on the non-light emitting region of the cathode layer 4, and the material of the auxiliary electrode layer 5 is electrically conductive.

Alternatively, the substrate 1 may be a material that is transparent and easy to form a light product, such as glass; the anode layer 2 may be a material having high conductivity, such as silver, aluminum or ITO (Indium Tin Oxide); the organic functional layer 3 may include a multilayer conductive material, such as CuPc (copper phthalocyanine), Alq3 (Tris(8-quinolinolato) aluminum) or LiF (lithium fluoride); the cathode layer 4 may be a material having high conductivity and high transparency, such as silver, magnesium or ITO; the auxiliary electrode layer 5 may be a material having high conductivity, such as nano silver.

The light source is incident from the organic functional layer 3 to the cathode layer 4 and is emitted from the light emitting region of the cathode layer 4; since the auxiliary electrode layer 5 has high conductivity, the resistance of the entire cathode layer 4 is reduced, then the voltage difference between the center and the edge of the screen become smaller, in the organic function layer 3 the brightness difference of the light generated at the position corresponding the center and the edge of the screen becomes smaller, so that the display brightness of the entire screen is more uniform; simultaneously, the auxiliary electrode layer 5 covers only the non-light emitting region of the cathode layer 4, does not block the light passing through the light emitting region of the cathode layer 4, and does not affect the display brightness of the screen.

By providing the conductive auxiliary electrode layer on the non-light emitting region of the cathode layer of the OLED device, the present invention can increase the conductivity of the cathode layer, reduce the voltage difference between the center and the edge of the screen, and improve the display effect without blocking the light emitting region and not affecting the display brightness of the light emitting region.

Figure 2:
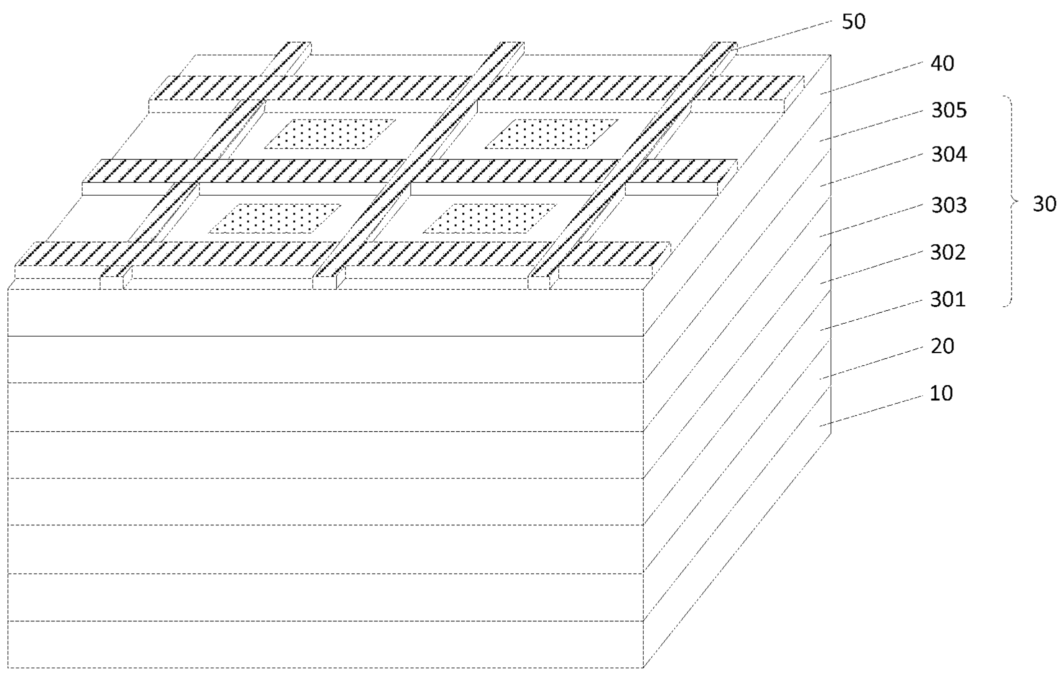
FIG. 2 is a schematic structural view of another embodiment of the top-emitting OLED device according to the present invention.
Figure 3:
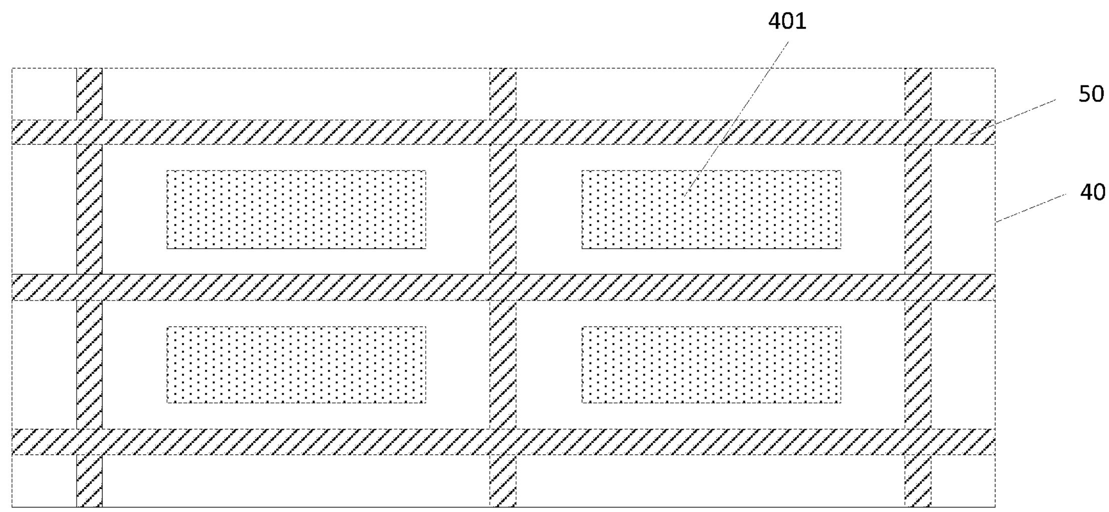
FIG. 3 is a top-view schematic of the cathode layer and the auxiliary electrode layer of another embodiment of the top-emitting OLED device according to the present invention.

Referring to FIGS. 2 to 3, another embodiment of the top-emitting OLED device of the present invention includes:

a substrate 10, an anode layer 20, an organic functional layer 30, a cathode layer 40, and an auxiliary electrode layer 50 sequentially arranged, wherein the auxiliary electrode layer 50 is arranged on the non-light emitting region of the cathode layer 40, and the material of the auxiliary electrode layer 50 is electrically conductive.

Alternatively, the organic functional layer 30 includes a hole injection layer 301, a hole transport layer 302, a light emitting layer 303, an electron transport layer 304, and an electron injection layer 305, wherein the hole injection layer 301, the hole transport layer 302, the light emitting layer 303, the electron transport layer 304, and the electron injection layer 305 are electrically connected in turn, the hole injection layer 301 is electrically connected to the anode layer 20, and the electron injection layer 305 is electrically connected to the cathode layer 40.

Alternatively, the hole injection layer 301 may be a material that facilitates the control of the hole injection rate, such as CuPc; the hole transport layer 302 may be a material having high thermal stability and facilitating hole transport, such as NPB (N,N'-(1-naphthyl)-N, N'-diphenyl-4,4'-biphenylenediamine); the light emitting layer 303 may be a material having high light emitting efficiency, such as Alq3; the electron transport layer 304 may be a material having high thermal stability and facilitating electron transport, such as PBD (2-(4-biphenyl)-5-(4-tert-butyl) phenyl-1,3,4-oxadiazole); and the electron injection layer 305 may be a material that facilitates the control of the electron injection rate, such as LiF.

Alternatively, the auxiliary electrode layer 50 has a mesh structure, the mesh holes correspond to the light emitting region 401, and the line width of the auxiliary electrode layer 50 is less than the distance between the light emitting regions 401 of the cathode layer 40.

Alternatively, the thickness of the auxiliary electrode layer 50 is greater than 500 nm and is less than the distance between the cathode layer 40 and the cover plate (not shown). When the OLED device is in a flexible package, the thickness of the auxiliary electrode layer 50 is less than 5 μm.

Under the external driving, the electrons are driven from the cathode layer 40 through the electron injection layer 305 and the electron transport layer 304 to the light emitting layer 303, and the holes pass from the anode layer 20 through the hole injection layer 301 and the hole transport layer 302 to the light emitting layer 303, the electrons and holes interact with each other at the light emitting layer 303 to emit light, and light passes through the electron transport layer 304 and the electron injection layer 304, and is incident on the cathode layer 40, and is emitted from the light emitting region 401 of the cathode layer 40. Since the auxiliary electrode layer 50 covers only the non-light emitting region of the cathode layer 40 and does not block the light passing through the light emitting region 401 of the cathode layer 40, the material of the auxiliary electrode layer 50 may be a material having a higher light transmittance than the cathode layer, or may also be a material having a light transmittance lower than that of the cathode layer, such as nano silver.

By providing the conductive auxiliary electrode layer on the non-light emitting region of the cathode layer of the OLED device, the present invention can increase the conductivity of the cathode layer, reduce the voltage difference between the center and the edge of the screen, and improve the display effect without blocking the light emitting region and not affecting the display brightness of the light emitting region.

Figure 4:
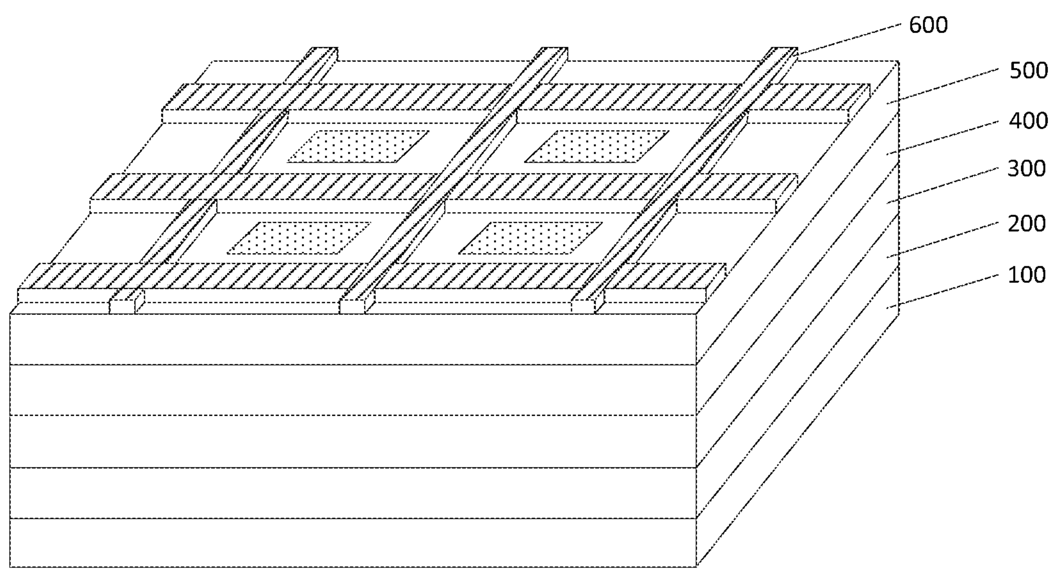
FIG. 4 is a schematic structural view of a further embodiment of the top-emitting OLED device according to the present invention.

Referring to FIG. 4, a further embodiment of the top-emitting OLED device of the present invention includes:

a substrate 100, an anode layer 200, an organic functional layer 300, a cathode layer 400, a cathode protection layer 500, and an auxiliary electrode layer 600 sequentially arranged, wherein the auxiliary electrode layer 600 is arranged on the cathode protection layer 500 corresponding to the non-light emitting region of the cathode layer 400, and the material of the auxiliary electrode layer 600 is electrically conductive.

Alternatively, a cathode protection layer 500 is arranged between the cathode layer 400 and the auxiliary electrode layer 600 for protecting the cathode layer 400 from contamination by the auxiliary electrode layer 600.

Alternatively, the cathode protection layer 500 may be a transparent conductive film, and the auxiliary electrode layer 600 is electrically connected to the cathode layer 400 through the cathode protection layer 500.

Alternatively, the cathode protection layer 500 may be a material having high light transmittance and high conductivity, such as IGO (Indium Gallium Zinc Oxide).

Specifically, the structure of the auxiliary electrode layer 600 is referred to as an auxiliary electrode layer in another embodiment of the top-emitting OLED device.

In the embodiment of the present invention, by providing the cathode protection layer on the cathode layer of the OLED device and providing the conductive auxiliary electrode layer on the cathode protection layer corresponding to the non-light emitting region of the cathode layer, the present invention can increase the conductivity of the cathode layer without affecting the cathode layer, reduce the voltage difference between the center and the edge of the screen, and improve the display effect without blocking the light emitting region and not affecting the display brightness of the light emitting region.

Figure 5:
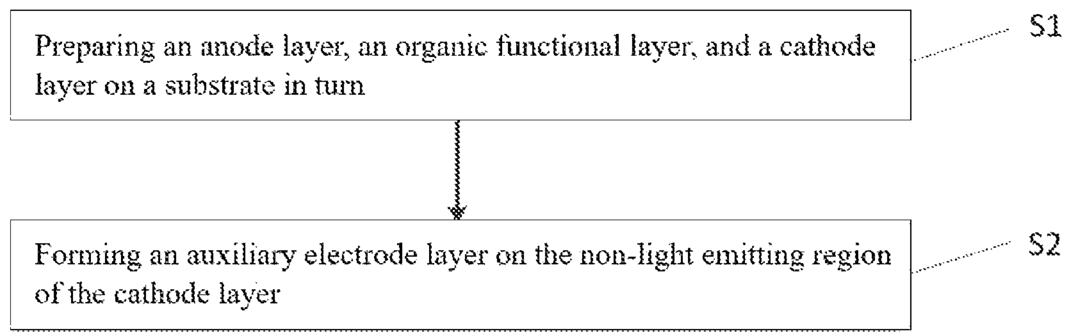
FIG. 5 is a schematic flow diagram of an embodiment of a method of manufacturing the top-emitting OLED device according to the present invention.

Referring to FIG. 5, an embodiment of a method of manufacturing a top-emitting OLED device of the present invention includes:

S1: preparing an anode layer, an organic functional layer, and a cathode layer on a substrate in turn;

Alternatively, preparing the anode layer, the organic functional layer, and the cathode layer by vapor deposition, printing, or the like.

S2: forming an auxiliary electrode layer on the non-light emitting region of the cathode layer.

Specifically, nano-silver ink may be coated as the auxiliary electrode layer on the non-light emitting region of the cathode layer by IJP (Ink Jet Printing), a dispenser, a screen printing or the like, wherein the line width of the auxiliary electrode layer is less than the distance between the light emitting regions, the thickness of the auxiliary electrode layer is greater than 500 nm and less than the distance between the cathode layer and the cover plate; and then the OLED device is heat treated to remove the solvent in the nano silver ink, wherein the temperature of the heat treatment is less than 80° C.

Alternatively, the material of the auxiliary electrode layer may be other conductive material.

Alternatively, the solvent in the nano silver ink may be a solvent that does not contaminate or interfere with other component layers.

By providing the conductive auxiliary electrode layer on the non-light emitting region of the cathode layer of the OLED device, the present invention can increase the conductivity of the cathode layer, reduce the voltage difference between the center and the edge of the screen, and improve the display effect without blocking the light emitting region and not affecting the display brightness of the light emitting region.

Figure 6:
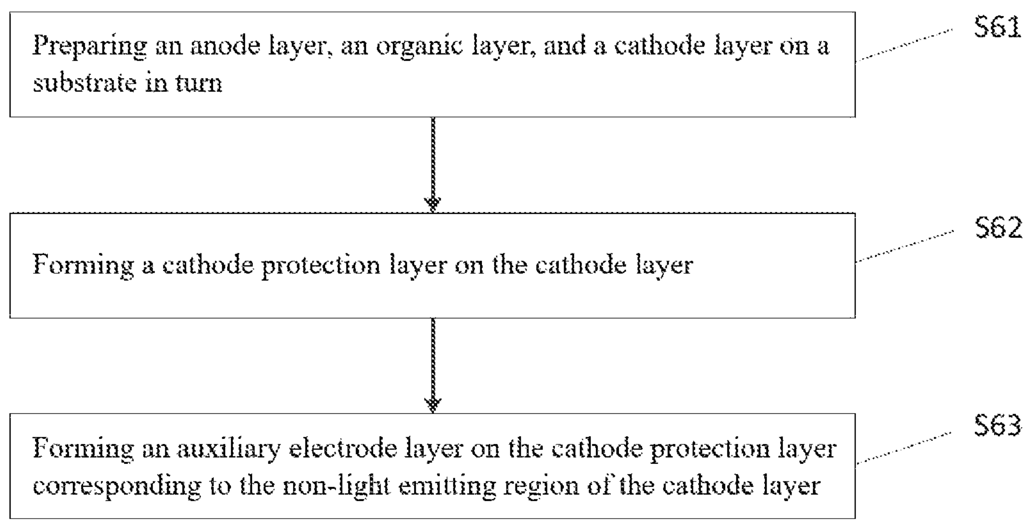
FIG. 6 is a schematic flow diagram of another embodiment of a method for manufacturing the top-emitting OLED device according to the present invention.

Referring to FIG. 6, another embodiment of a method of manufacturing a top-emitting OLED device of the present invention includes:

S61: preparing an anode layer, an organic functional layer, and a cathode layer on the substrate in turn;

S62: forming a cathode protection layer on the cathode layer;

Alternatively, IGO may be sputtered on the entire surface of the cathode layer as a cathode protection layer; since the process temperature of the IGO is less than 80° C., contamination and damage to the cathode layer are not caused.

Alternatively, the cathode protection layer may be prepared by coating, printing, or the like.

Alternatively, the material of the cathode protection layer may also be other materials of which the process temperature is less than the process temperature of the cathode layer.

S63: forming an auxiliary electrode layer on the cathode protection layer corresponding to the non-light emitting region of the cathode layer.

Specifically, the manufacturing method of the auxiliary electrode layer is referred to the manufacturing method of the auxiliary electrode layer which is in one embodiment of the manufacturing method of the top-emitting OLED device.

In the embodiment of the present invention, by providing the cathode protection layer on the cathode layer of the OLED device and providing the conductive auxiliary electrode layer on the cathode protection layer corresponding to the non-light emitting region of the cathode layer, the present invention can increase the conductivity of the cathode layer without affecting the cathode layer, reduce the voltage difference between the center and the edge of the screen, and improve the display effect without blocking the light emitting region and not affecting the display brightness of the light emitting region.

Figure 7:
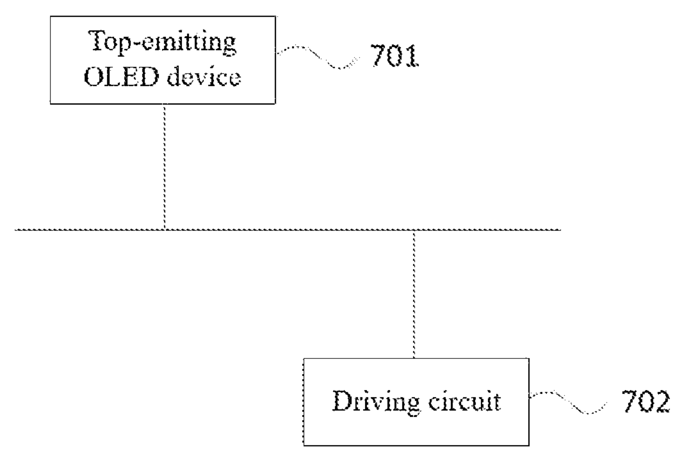
FIG. 7 is a schematic structural view of an embodiment of the display panel according to the present invention.

Referring to FIG. 7, an embodiment of the display panel of the present invention includes:

a top-emitting OLED device 701, the top-emitting OLED device 701 includes a substrate, an anode layer, an organic functional layer, a cathode layer, and an auxiliary electrode layer sequentially arranged, wherein the auxiliary electrode layer is arranged on the non-light emitting region of the cathode layer and the material of the auxiliary electrode layer is electrically conductive;

a driving circuit 702, coupled to the anode layer and/or the cathode layer, for controlling the OLED device 701 to emit light.

Specifically, the structure of the top-emitting OLED device 701 is referred to the embodiment of the top-emitting OLED device.

By providing the conductive auxiliary electrode layer on the non-light emitting region of the cathode layer of the OLED device, the present invention can increase the conductivity of the cathode layer, reduce the voltage difference between the center and the edge of the screen, and improve the display effect without blocking the light emitting region and not affecting the display brightness of the light emitting region.

Above are only embodiments of the present invention is not patented and therefore limit the scope of the present invention, the use of any content of the present specification and drawings made equivalent or equivalent structural transformation process, either directly or indirectly related to the use of other technologies areas are included in the same way the scope of the patent protection of the present invention.

What is claimed is:

1. A display panel, comprising:

a top emitting OLED device, comprising a substrate, an anode layer, an organic functional layer, a cathode layer, a cathode protection layer, and an auxiliary electrode layer sequentially arranged, wherein the cathode protection layer is for protecting the cathode layer from being contaminated by the auxiliary electrode layer; the auxiliary electrode layer is a mesh structure, arranged on a non-light emitting region of the cathode layer, mesh holes corresponds to light emitting regions, and a material of the auxiliary electrode layer is electrically conductive;

wherein the auxiliary electrode layer is arranged on the cathode protection layer, the entirety of a first face of the auxiliary electrode layer facing to the cathode protection layer is directly contacted with a second face of the cathode protection layer facing to the auxiliary electrode layer, the mesh structure comprises a plurality of horizontal strips and a plurality of longitudinal strips, each horizontal strip is perpendicular to each longitudinal strip;

a driving circuit, coupled to the anode layer and/or the cathode layer, for controlling light emission of the OLED device.

2. The display panel according to claim 1, wherein a line width of the auxiliary electrode layer is smaller than a pitch between the light emitting regions of the cathode layer.

3. The display panel according to claim 2, wherein a thickness of the auxiliary electrode layer is greater than 500 nm and less than a distance between the cathode layer and a cover plate, and when the OLED device is in a flexible package, the thickness of the auxiliary electrode layer is less than 5 μm.

4. The display panel according to claim 1, wherein the cathode protection layer is a transparent conductive film, and the auxiliary electrode layer is electrically connected to the cathode layer through the cathode protection layer.

5. A top emitting OLED device, comprising:

a substrate, an anode layer, an organic functional layer, a cathode layer, and an auxiliary electrode layer sequentially arranged, wherein the auxiliary electrode layer is arranged on a non-light emitting region of the cathode layer, and a material of the auxiliary electrode layer is electrically conductive;

wherein the auxiliary electrode layer is arranged on the cathode protection layer, the entirety of a first face of the auxiliary electrode layer facing to the cathode protection layer is directly contacted with a second face of the cathode protection layer facing to the auxiliary electrode layer, the auxiliary electrode layer is a mesh structure, the mesh structure comprises a plurality of horizontal strips and a plurality of longitudinal strips, each horizontal strip is perpendicular to each longitudinal strip.

6. The OLED device according to claim 5, wherein mesh holes corresponds to light emitting regions, and a line width of the auxiliary electrode layer is smaller than a pitch between the light emitting regions of the cathode layer.

7. The OLED device according to claim 6, wherein a thickness of the auxiliary electrode layer is greater than 500 nm and less than a distance between the cathode layer and a cover plate, and when the OLED device is in a flexible package, a thickness of the auxiliary electrode layer is less than 5 μm.

8. The OLED device according to claim 5, further comprising:

a cathode protection layer, disposed between the cathode layer and the auxiliary electrode layer, for protecting the cathode layer from being contaminated by the auxiliary electrode layer.

9. The OLED device according to claim 8, wherein the cathode protection layer is a transparent conductive film, and the auxiliary electrode layer is electrically connected to the cathode layer through the cathode protection layer.

10. The OLED device according to claim 5, wherein the organic functional layer comprises a hole injection layer, a hole transporting layer, a light emitting layer, an electron transporting layer, and an electron injection layer, wherein the hole injection layer, the hole transporting layer, the light emitting layer, the electron transporting layer, and the electron injection layer are electrically connected in turn, the hole injection layer is electrically connected to the anode layer, and the electron injection layer is electrically connected to the cathode layer.

* * * * *